(12) United States Patent
Xu et al.

(10) Patent No.: US 8,804,875 B1
(45) Date of Patent: Aug. 12, 2014

(54) POLAR RECEIVER ARCHITECTURE AND SIGNAL PROCESSING METHODS

(71) Applicant: Innophase Inc., Chicago, IL (US)

(72) Inventors: Yang Xu, Chicago, IL (US); Sara Munoz Hermoso, Chicago, IL (US)

(73) Assignee: Innophase Inc., Chicago, IL (US)

( * ) Notice: Subject to any disclaimer, the term of this patent is extended or adjusted under 35 U.S.C. 154(b) by 0 days.

(21) Appl. No.: 13/925,080

(22) Filed: Jun. 24, 2013

Related U.S. Application Data

(63) Continuation of application No. 13/840,478, filed on Mar. 15, 2013.

(51) Int. Cl.
*H03D 3/18* (2006.01)
*H04L 27/227* (2006.01)

(52) U.S. Cl.
CPC .................................. *H04L 27/2272* (2013.01)
USPC ........... 375/327; 375/316; 375/324; 375/344; 455/208; 455/209; 455/214; 455/255; 455/258; 455/263; 455/265

(58) Field of Classification Search
CPC . H04L 27/22; H04L 27/2071; H04L 27/2272; H04B 1/0039; H03D 5/00
USPC .......... 375/316, 324, 327, 344; 455/208, 209, 455/214, 255, 258, 263, 265
See application file for complete search history.

(56) References Cited

U.S. PATENT DOCUMENTS

| | | | |
|---|---|---|---|
| 6,369,659 B1 | 4/2002 | Delzer et al. | |
| 6,556,636 B1 | 4/2003 | Takagi | |
| 6,975,165 B2 | 12/2005 | Lopez Villegas et al. | |
| 7,095,274 B2 | 8/2006 | Lopez Villegas et al. | |
| 7,564,929 B2 | 7/2009 | Lopez Villegas et al. | |
| 8,498,601 B2 * | 7/2013 | Horng et al. | 455/265 |

OTHER PUBLICATIONS

Jose Maria Lopez-Villegas et al., BPSK to ASK Signal Conversion Using Injection-Locked Oscillators—Part I: Theory, Dec. 2005, IEEE Transactions on Microwave Theory and Techniques, vol. 53, No. 12, available online at: http://diposit.ub.edu/dspace/bitstream/2445/8751/1/529612.pdf.

International Search Report for PCT/US2013/024159 mailed Apr. 9, 2013.

Chi-Tsan Chen, Cognitive Polar Receiver Using Two Injection-Locked Oscillator Stages, IEEE Transactions on Microwave Theory and Techniques, vol. 59, No. 12, Dec. 2011.

N. Siripon, et al., Novel Sub-Harmonic Injection-Locked Balanced Oscillator, Microwave and Systems Research Group (MSRG), School of Electronics, Computing and Mathematics, University of Surrey, Sep. 24, 2011, 31st European Microwave Conference.

Hamid R Rategh, et al., Superharmonic Injection Locked Oscillators as Low Power Frequency Dividers, Stanford University, Stanford, California.

(Continued)

*Primary Examiner* — Leon Flores
(74) *Attorney, Agent, or Firm* — Invention Mine LLC

(57) ABSTRACT

Compressing a variable phase component of a received modulated signal with a second harmonic injection locking oscillator, and generating a delayed phase-compressed signal with a fundamental injection locking oscillator, and combining the phase-compressed signal and the delayed phase-compressed signal to obtain an estimated derivative of the variable phase component, and further processing the estimated derivative to recover data contained within the received modulated signal.

30 Claims, 9 Drawing Sheets

(56) References Cited

OTHER PUBLICATIONS

Behzad Razavi, A Study of Injection Pulling and Locking in Oscillators, Electrical Engineering Department, University of California, 2003, IEEE, Custom Integrated Circuits Conference.

Marc Tiebout, A 50GHz Direct Injection Locked Oscillator Topology as Low Power Frequency Divider in 0.13 μm CMOS, Infineon Technologies AG, Solid-State Circuits Conference, 2003, pp. 73-76, 29th European ESSCIRC.

Pei-Kang Tsai, et al., Wideband Injection-Locked Divide-by-3 Frequency Divider Design with Regenerative Second-Harmonic Feedback Technique, RF@CAD Laboratory, Department of Electrical Engineering, National Cheng Kung University, Tainan, Taiwan.

\* cited by examiner

US 8,804,875 B1

POLAR RECEIVER ARCHITECTURE AND SIGNAL PROCESSING METHODS

CROSS REFERENCE TO RELATED APPLICATIONS

This application is a continuation of and claims priority under 35 USC §120 to U.S. application Ser. No. 13/840,478, filed Mar. 15, 2013, entitled "Polar Receiver Architecture and Signal Processing Methods", which is assigned to the assignee of the present application and is incorporated herein by reference. This application is related to the following co-pending applications, all of which are incorporated herein by reference in their entirety: U.S. application Ser. No. 13/839,557, filed Mar. 15, 2013, entitled POLAR RECEIVER SIGNAL PROCESSING APPARATUS AND METHODS; U.S. application Ser. No. 13/839,462 filed Mar. 15, 2013, entitled LNA WITH LINEARIZED GAIN OVER EXTENDED DYNAMIC RANGE; U.S. application Ser. No. 13/840,379 filed Mar. 15, 2013, entitled DIGITALLY CONTROLLED INJECTION LOCKED OSCILLATOR; and, U.S. application Ser. No. 13/842,470, filed Mar. 15, 2013, entitled SINGLE-BIT DIRECT MODULATION TRANSMITTER.

BACKGROUND OF THE INVENTION

Communications transceivers may utilize numerous architectures to recover data from a modulated carrier signal. These architectures include coherent demodulation, using either intermediate frequency conversion or direct-conversion receivers. Such receivers typically recover or regenerate the communications carrier signal using a phase-locked loop (PLL) and coherent demodulation. Recently, polar receiver architectures have been proposed that extract the modulation phase components from a received modulation signal without using a carrier recovery circuitry. However, the proposed polar receiver architectures and associated signal processing have deficiencies that result in poor performance and high bit error rates (BER). Accordingly, there is a need for improved polar receiver signal processing and architectures.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
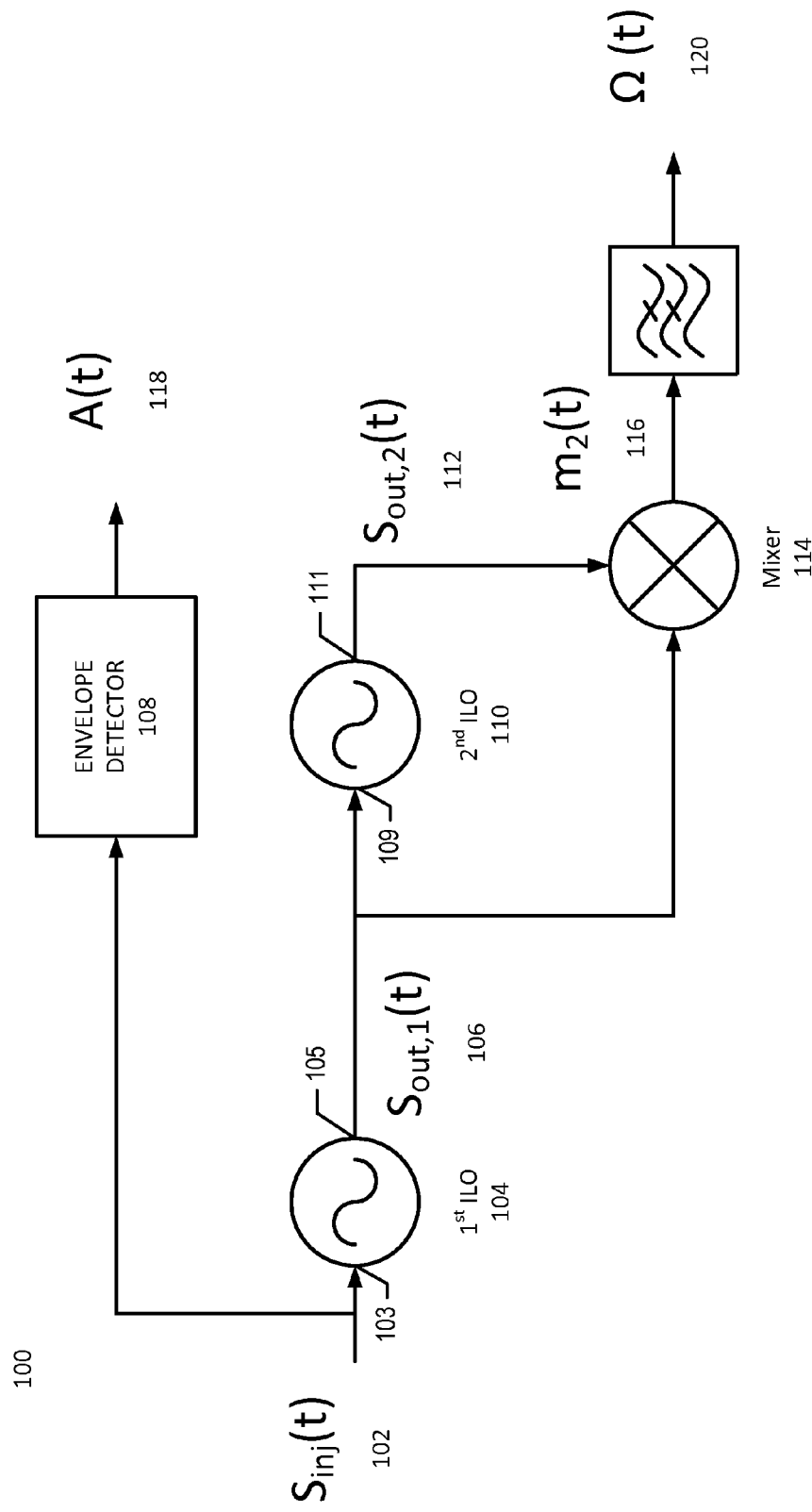
FIG. 1 is a block diagram of a polar receiver in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

With reference to FIG. 1, a block diagram of a polar receiver 100 will be described in accordance with some embodiments. The injection signal $S_{inj}(t)$ 102, which is a received modulated signal having a variable phase component, is applied to an input node 103 of the second harmonic injection locked oscillator (ILO) 104 (also referred to herein as a harmonic ILO). The output signal of the harmonic ILO $S_{out,1}(t)$ 106 at node 105 has a compressed variable phase component, as will be described below. The compressed variable phase signal 106 is applied to input node 109 of the fundamental injection locked oscillator ILO 110 (also referred to herein as a fundamental ILO), and undergoes a delay to generate the output signal $S_{out,2}(t)$ 112 at output node 111. That is, $S_{out,1}(t)$ 106 and $S_{out,2}(t)$ 112 are related by a time delay imposed by fundamental ILO 110. $S_{out,1}(t)$ 106, which is the phase compressed signal, and $S_{out,2}(t)$ which is the delayed phase compressed signal, are applied to mixer 114 to generate an output signal $m_2(t)$ 116. The mixer output signal 116 is low pass filtered to remove the double frequency components present at the output of the mixer 114, to obtain an estimated phase derivative signal $\Omega(t)$ 120. The injection signal $S_{inj}(t)$ 102 is also applied to the envelope detector 108 to generate and amplitude waveform A(t) 118.

Figure 2:
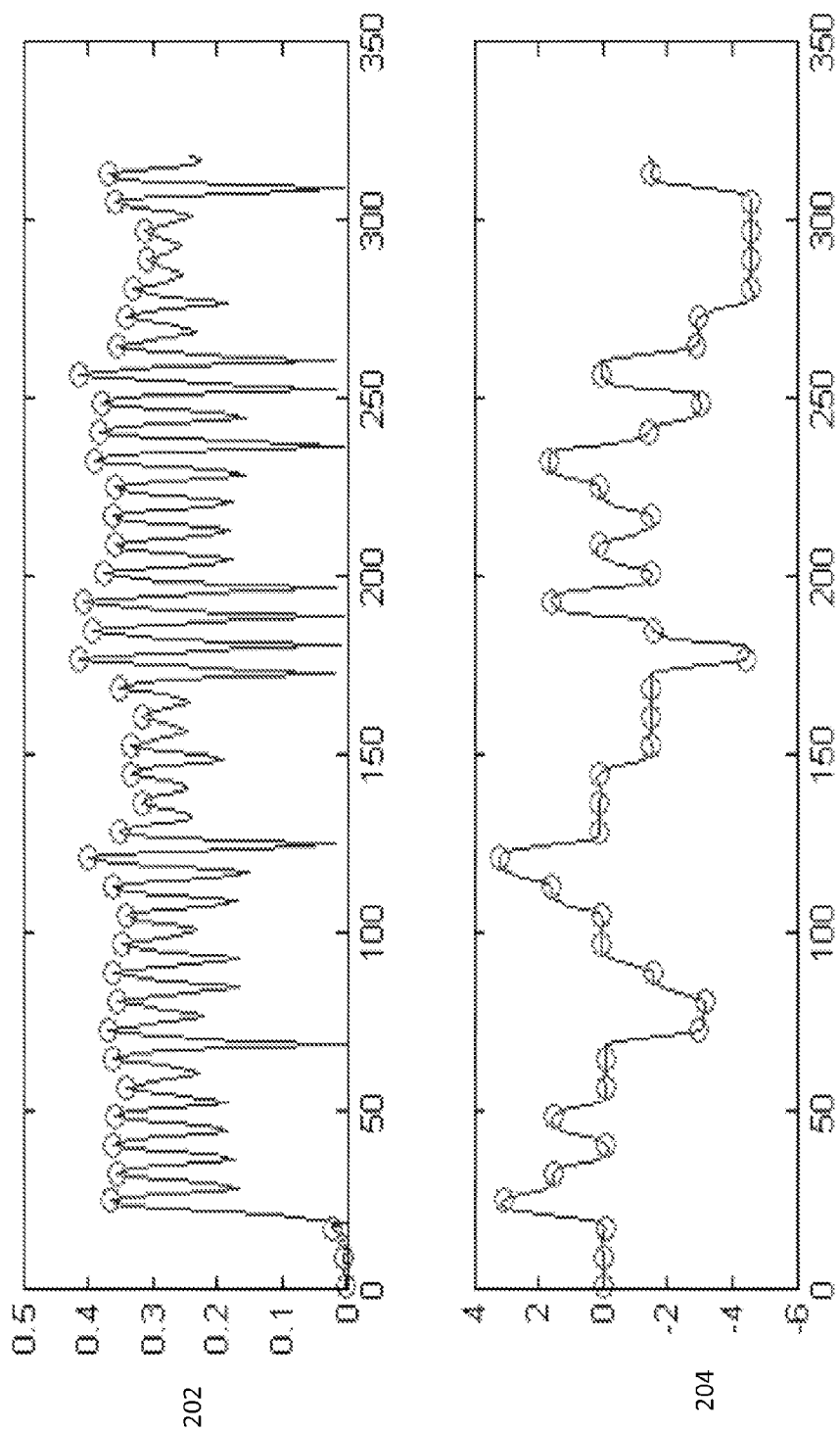
FIG. 2 is a signal diagram of amplitude and phase information generated by a polar receiver in accordance with some embodiments.

With reference to FIG. 2, the output of the polar receiver is depicted as an amplitude signal A(t) 118, 202 and phase information 204 generated by integrating the estimated phase derivative signal $\Omega(t)$ 120 from the polar receiver in accordance with some embodiments.

Figure 3:
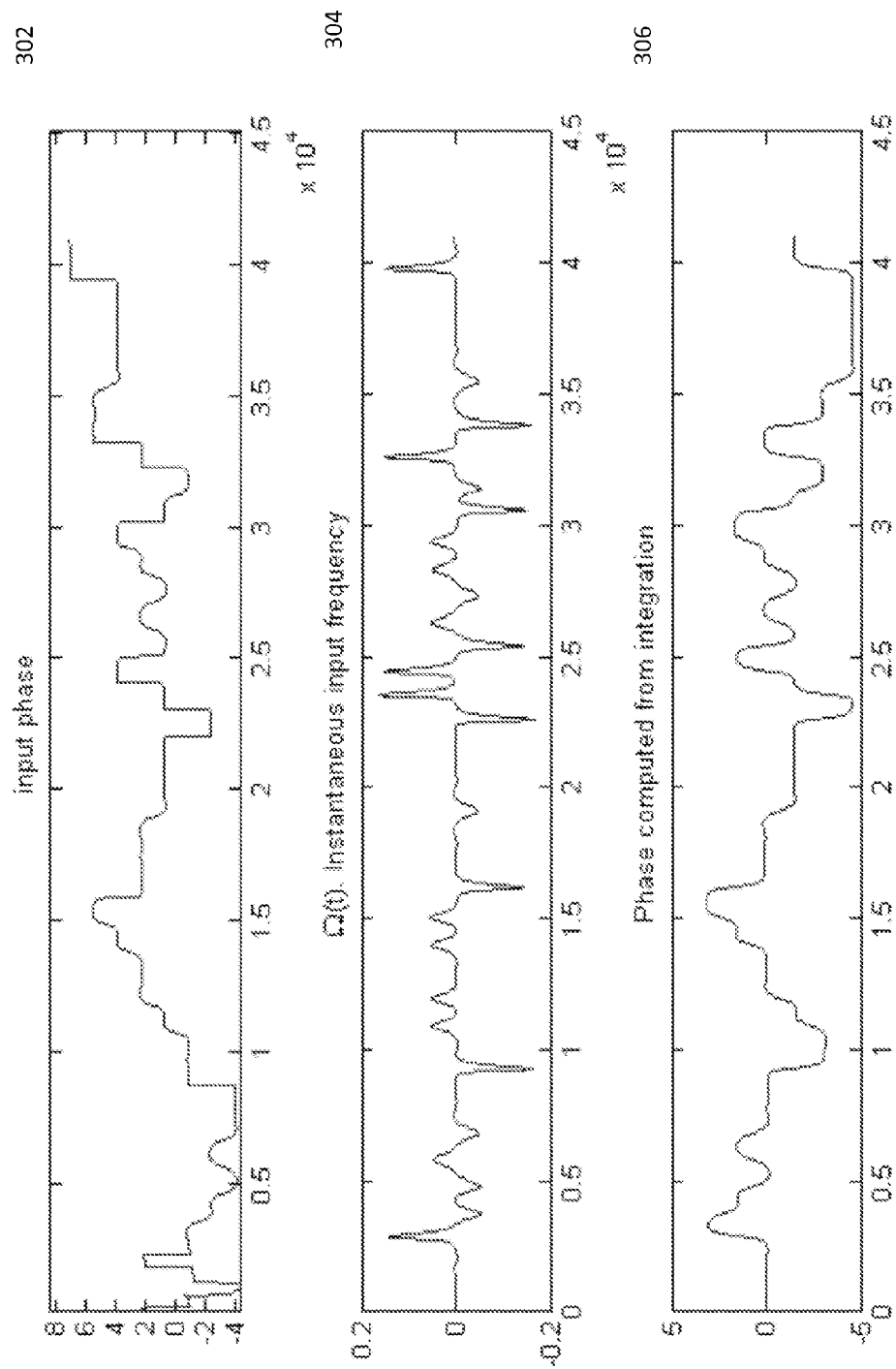
FIG. 3 is a signal diagram of input and output signals associated with a polar receiver in accordance with some embodiments.

With reference to FIG. 3, the variable phase component 302 of a received modulated signal is compared against the estimated phase derivative signal 304 (or equivalently, the instantaneous frequency signal), and the recovered phase signal 306 obtained by integrating the instantaneous input frequency signal 304, in accordance with some embodiments.

Figure 4:
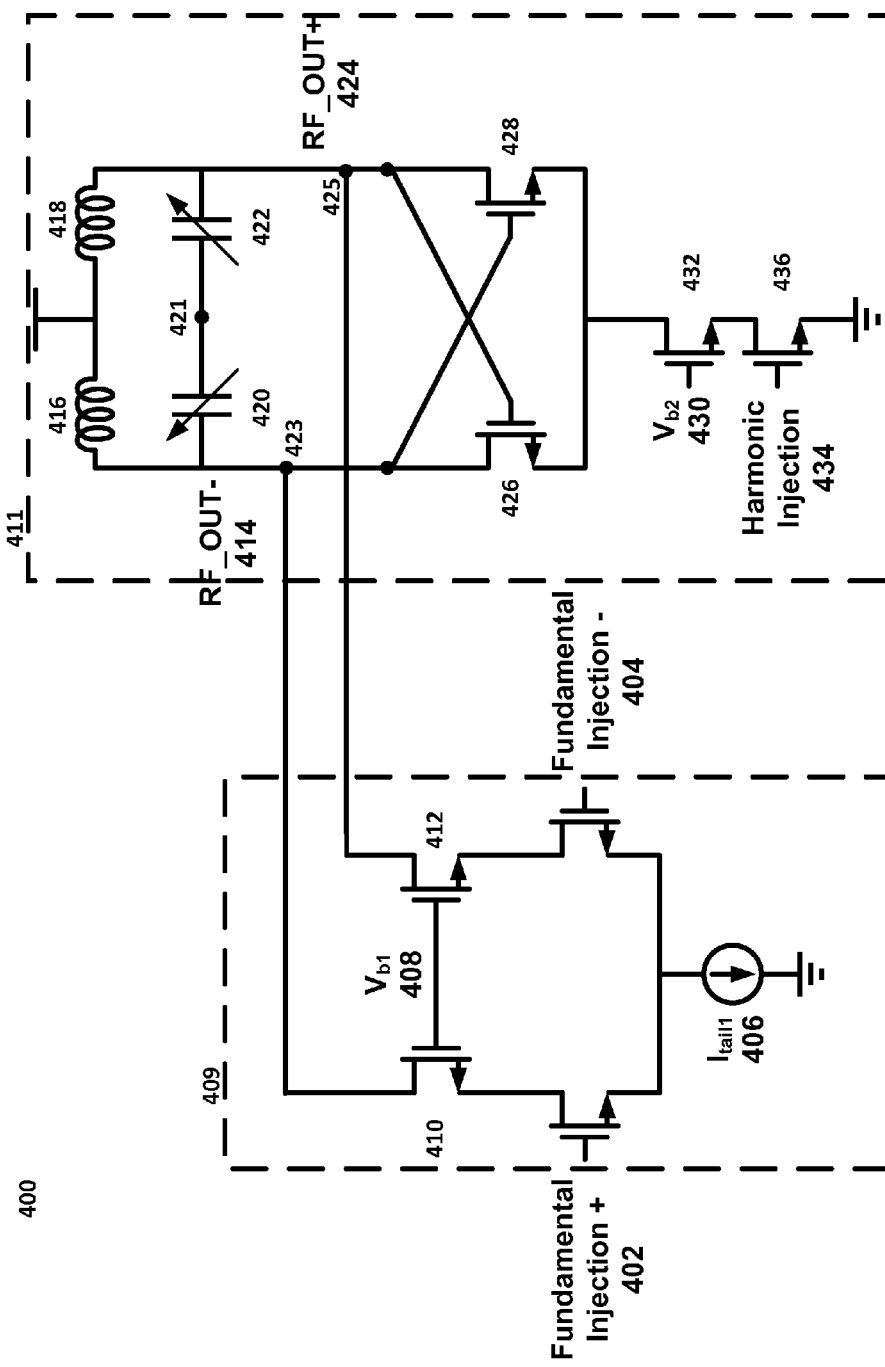
FIG. 4 is a circuit diagram of one embodiment of an injection locking oscillator in accordance with some embodiments.

With reference to FIG. 4, an example of an injection locking oscillator 400 will be described. In one embodiment, the ILO 400 may be configured with a harmonic injection node at the common mode node 434 using FET 436. In an alternative embodiment the common mode node 421 may also be used for harmonic injection. In yet a further alternative embodiment both nodes 421 and 434 may be used to inject a harmonic locking signal. The tank circuit together with the cross-coupled transistor pair 426, 428, will oscillate and lock to a frequency associated with a harmonic of the injection signal.

In one embodiment the harmonic is a 2nd harmonic, such that the output frequency at nodes 423, 425 will be one half the frequency of the injected signal. In the harmonic ILO embodiment the transconductance gain stage 409 is not necessary—is either switched off by a control circuit, or is not present. The resonance circuit 411 may include a tank circuit having variable capacitors 420, 422, and inductors 416, 418. In an alternative embodiment the tank circuit may take the form of an RC tank circuit, and include variable capacitors and resistors.

Alternatively the ILO 400 may be configured with a fundamental injection signal applied at nodes 402, 404, in a differential manner. Together with the transistor pair 410, 412, stage 409 provides a transconductance of the voltage input signal to a current signal to be injected at nodes 423, 425. The tank circuit together with the cross-coupled transistor pair 426, 428, will oscillate and lock to a frequency associated with the fundamental injection signal.

Variations and further details of ILOs are described more fully in co-pending application Attorney Docket 71604.US.01 filed Mar. 15, 2013, entitled DIGITALLY CONTROLLED INJECTION LOCKED OSCILLATOR.

In one embodiment, the polar receiver apparatus comprises a first ILO using harmonic injection to receive a modulated signal on the input having phase variations of a first range. The harmonic injection ILO may be similar to that shown in FIG. 4, but configured to use one or more of the common mode injection points 434, 421, while not having an injection signal on fundamental injection points 402, 404. The harmonic ILO generates an output signal at differential output nodes 414, 424 that restricts the range of phase variations to a range that may by one-half the first range.

In an embodiment, the ILO 104 is a second-harmonic injection locking oscillator having an input node 103 that receives the modulated signal. The modulated signal may be provided by an analog front-end (AFE) signal processing circuit. The AFE may include a tuning function, or channel selection function. Tuning or channel selection refers to the isolation of a desired signal at a desired frequency, also commonly referred to as a channel. Tuning or channel selection may also include isolating a signal of a predetermined bandwidth, where a first desired signal may be of a first bandwidth, and a second desired signal may have a different bandwidth.

The second harmonic ILO provides a phase-compressed signal at a compressed signal output node 105. That is, the second harmonic ILO is configured to receive at harmonic ILO input node 103 a modulated signal having a variable phase component with phase variations in a first phase range, and responsively generate, at the compressed output node 105, a phase-compressed signal having a compressed variable phase component in a compressed phase range being substantially one half the first phase range.

Figure 5:
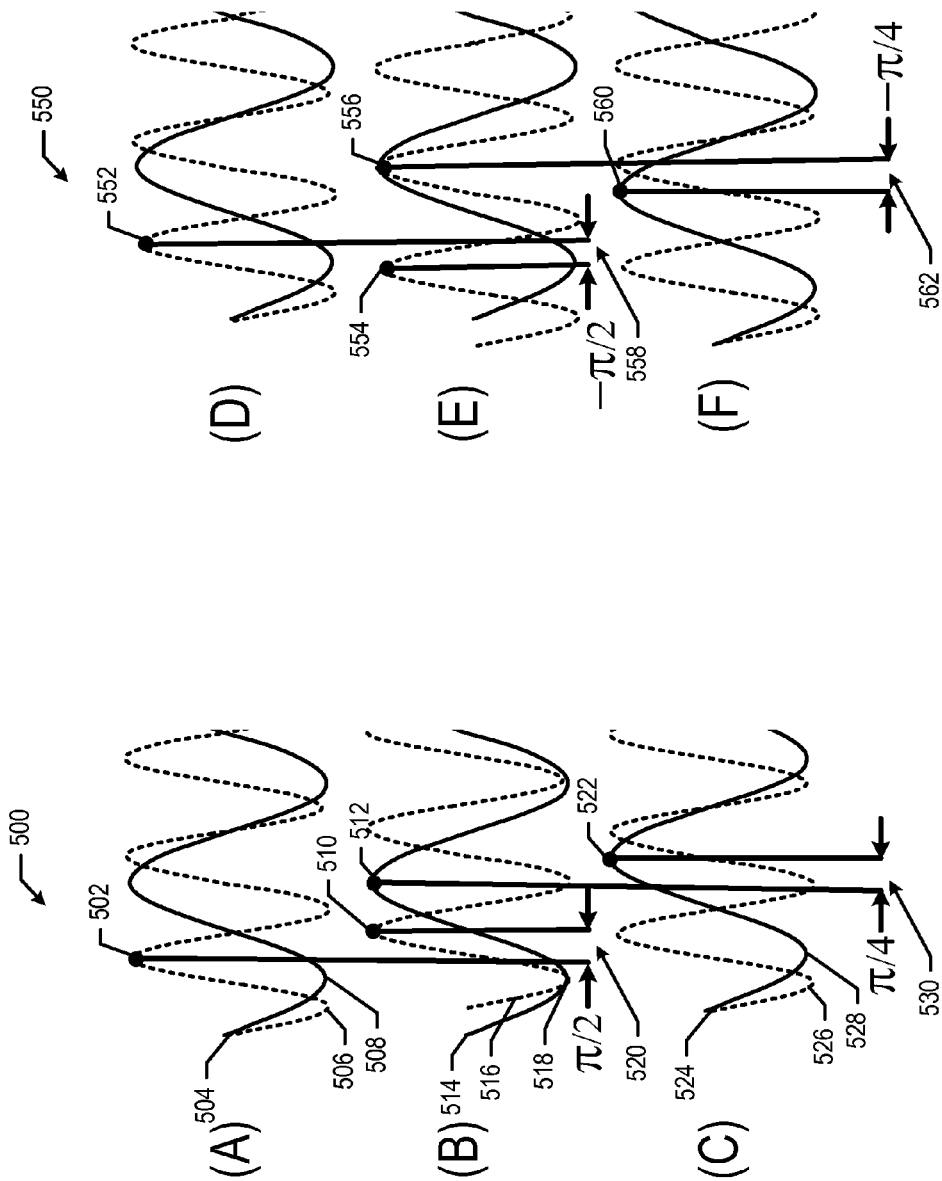
FIG. 5 is a signal plot showing ILO signal relationships.

This relationship between phase changes associated with the input signal and corresponding phase changes in the output harmonic signal may be better understood with respect to FIG. 5. The effect of a $\pi/2$ change of phase in the input signal results in a $\pi/4$ change of phase in the output. In particular, input signal 506 (shown in dashed line) has twice the frequency of the output signal 508. As shown in plot (A), the input 506 and output 508 have a steady state alignment as can be seen generally with respect to the signal alignment at point 504, where both signals are initiating a downward swing from a DC or average value. Note that this particular alignment is depicted only for convenience of explanation, and the specific steady relationship between input and output signals may take a different value.

In intermediate plot (B) the input signal 516 is delayed by 90°, or $\pi/2$ radians, while ILO output signal 514 has not yet changed. The net phase relationship between input and output signals has therefore changed, as may be conveniently observed with reference to the signal alignment at point 518, where the signals align at the negative peaks, as compared to the alignment that previously occurred on the downward slope at 504. The change in phase of input signal 516 can be seen with reference to points 502 and 510, which is seen to be equal to $\pi/2$ as shown by 520. The phase change of input 516 may be the result of modulation of the input signal. While FIG. 5 depicts a discrete phase change, such as may occur in PSK signals, the properties of phase compression described herein apply as well to any other type of modulation where there is a varying phase component, including OFDM.

Plot (C) depicts the condition where the output signal 528 has relocked and has achieved its initial phase relationship with respect to input signal 526 as may be seen with reference to the signal alignment at point 524 (i.e., the signals are back in alignment as shown at initial point 504 in plot (A). A comparison of points 512 and 522, which are the peaks of the output signal before and after relocking, shows a change 530 of only $\pi/4$ radians in the output signal as a result of the input phase change 520 of $\pi/2$ radians.

Again with respect to FIG. 5, plots (D), (E) and (F) 550 depict initial, intermediate, and final signals plots, respectively, depicting a $-\pi/2$ radian phase change 558 of the input signal which can be seen by a comparison of the input signal peak points 552 and 554 before and after the phase change, respectively. The corresponding $-\pi/4$ radians output phase change 562 may be seen by comparing the peaks of the output signal at 556 before the ILO relocking and at 560 after the output has regained its steady state phase relationship to the input signal.

The second harmonic ILO of the polar receiver is therefore configured to receive a modulated signal having phase variations in a first range $\pm\phi$ radians, and provide an output signal having a second range of phase variations equal to $\pm\phi/2$ radians. The apparatus may be configured to receive a modulated signal in the form of either a phase shift keying signal, a quadrature amplitude modulated signal, a single carrier signal, or an orthogonal frequency division multiplexed signal.

Again with respect to FIG. 1, the fundamental ILO has an input node connected to the compressed output node of the harmonic ILO. The fundamental ILO also has a delayed-output node, and is configured to generate, at the delayed output node, a phase-compressed signal having a delayed compressed variable phase component that is delayed relative to the compressed variable phase component. A mixer may then use the input and output of the fundamental ILO to generate an estimate of the derivative of the phase changes of the phase-compressed signal (and hence, an estimate of the original phase variations in the received modulated signal, as described more fully below).

One aspect of injection locking oscillators is referred to as a metastable state. The metastable state may result in the phenomena that when a phase change of the input signal occurs, the ILO may regain its locked condition by adjusting the phase of its output in a direction opposite to the input phase change until the steady state condition is achieved. For example, the output signal 514 may move to its final phase relationship shown by output signal 528 by momentarily increasing its frequency to advance its phase by $\pi/4$ radians, or, alternatively, by momentarily decreasing its frequency to retard its phase by $-7\pi/4$ radians. Thus, in some cases, a phase change in an input signal caused by a momentary increase in the input signal frequency may actually result in a momentary decrease in the output frequency to delay the phase of the output signal until the ILO is again locked. Such a phenomenon imparts an erroneous change in the frequency/phase characteristic of the ILO output signal that may cause errors when using an input and output of a fundamental ILO to generate an estimate of the derivative of the phase variations.

Note that the errors may occur when the phase change of the input is large enough so that the input-output ILO phase difference is greater than a phase difference associated with the metastable state. Because the metastable state is more likely to impart erroneous frequency or phase changes in the ILO output when the input phase change is larger, the phase compression obtained from the use of a second harmonic ILO as an initial stage in the polar receiver significantly reduces errors and improves performance of the receiver.

In a further embodiment, the second harmonic ILO and the fundamental ILO may be adjustable to obtain the desired characteristics or performance of the polar receiver. In an embodiment, the second harmonic ILO may be adjusted to select a desired signal having a predetermined carrier frequency. The adjustment to the ILO may be to change the free-running frequency $f_r$ of the second harmonic ILO, such as by altering a capacitance of the ILO tank circuit. The polar receiver may include an ILO control circuit configured to measure a free running frequency $f_r$ of the ILO after removing the injection input signal, such as by controlling a switch. The ILO control circuit may adjust a capacitance of the tank circuit until the free running frequency $f_r$ has a desired relationship to the carrier signal $f_c$ (or channel center frequency). The desired relationship may be that $f_r$ is offset from $f_c/2$. The ILO control circuit may also adjust one or more parameters of the second harmonic ILO including an ILO injection coefficient $\alpha$, a quality factor Q, and a capacitance of a tank circuit to adjust the free running frequency $f_r$.

The ILO control circuit may also be configured to adjust one or more parameters of the fundamental ILO to adjust an amount of delay associated with the delayed phase-compressed signal. The delay may be adjusted by adjusting one or more parameters including an injection coefficient $\alpha$, a quality factor Q, and a free running frequency $f_r$. The injection coefficient may be adjusted by altering a transconductance stage at the ILO input, or by adding or removing parallel-configured signal injection node devices, or by altering bias signals within the ILO. The quality factor may be adjusted by altering a resistance value within the tank circuit. The free running frequency may be adjusted by altering a capacitance of the ILO tank circuit such as by a capacitor bank or varactor. In a further embodiment, the fundamental ILO may be configured to operate in a strong injection mode, as opposed to weak injection mode. Weak injection may be characterized by a low injection ratio, such as 0.1 (i.e., 10%). Strong injection may therefore include a range of injection coefficients $\alpha > 0.1$. In a further embodiment, the strong injection mode may include a range of injection coefficients $\alpha > 0.5$.

The characteristics of both the second harmonic ILO and fundamental ILO, including Q, $f_r$, and $\alpha$ may be adjusted according to the structures and methods described in co-pending application Attorney Docket 71604.US.01 filed Mar. 15, 2013, entitled DIGITALLY CONTROLLED INJECTION LOCKED OSCILLATOR.

The mixer has a first input node connected to the compressed output node and a second input node connected to the delayed-output node. The mixer may be, for example, a Gilbert Cell, or other suitable signal frequency mixer. The mixer is configured to combine the phase-compressed signal and the delayed phase-compressed signal, and to output, at the mixer output node, a signal containing an estimated derivative of the variable phase component. Generally, a mixer will provide at its output a signal having a frequency equal to the sum of the input signal frequencies and a signal at a frequency equal to the difference of the input signal frequencies.

In the polar receiver architecture described herein, the sum frequencies are not of interest, so the receiver includes a filter configured to remove the higher-frequency components and to thus generate an estimated variable phase component signal from the estimated derivative of the variable phase component. To improve the characteristics of the estimated variable phase component from the mixer, the phase relationship between the two mixer inputs may be adjusted as described above by altering parameters of the fundamental ILO. The low-pass filtered output of the mixer may be monitored while the fundamental ILO is adjusted to determine a satisfactory operating point. In one embodiment, the ILO is injected with a steady-state signal (i.e., a carrier signal having no phase changes) and is adjusted until the mixer output has a reduced or otherwise acceptable DC offset.

In the polar receiver architecture, some embodiments are configured to receive modulated signals having amplitude, or signal envelope variations. Note that the second-harmonic ILO may be configured to generate a phase-compressed signal having substantially reduced amplitude variations relative to the received modulated signal. The envelope being of more constant magnitude will result in less amplitude-induce phase distortion in the output of the fundamental ILO.

In some embodiments, the polar received may include an amplitude detector configured to process the received modulated signal and to output a magnitude signal representative of the magnitude of the received modulated signal. In this way, the envelop of the signal may be preserved, and later re-combined with the estimated phase signal.

The polar receiver may also include a polar demodulation circuit configured to recover data information from the estimated variable phase component signal. In an embodiment, the demodulation circuit may be configured to first convert the polar information (amplitude and phase signals) into more conventional inphase and quadrature signal components, commonly referred to as I and Q signals. These conventional IQ signals may then be processed using well-developed signal processing techniques and architectures, which need not be reiterated herein.

Figure 6:
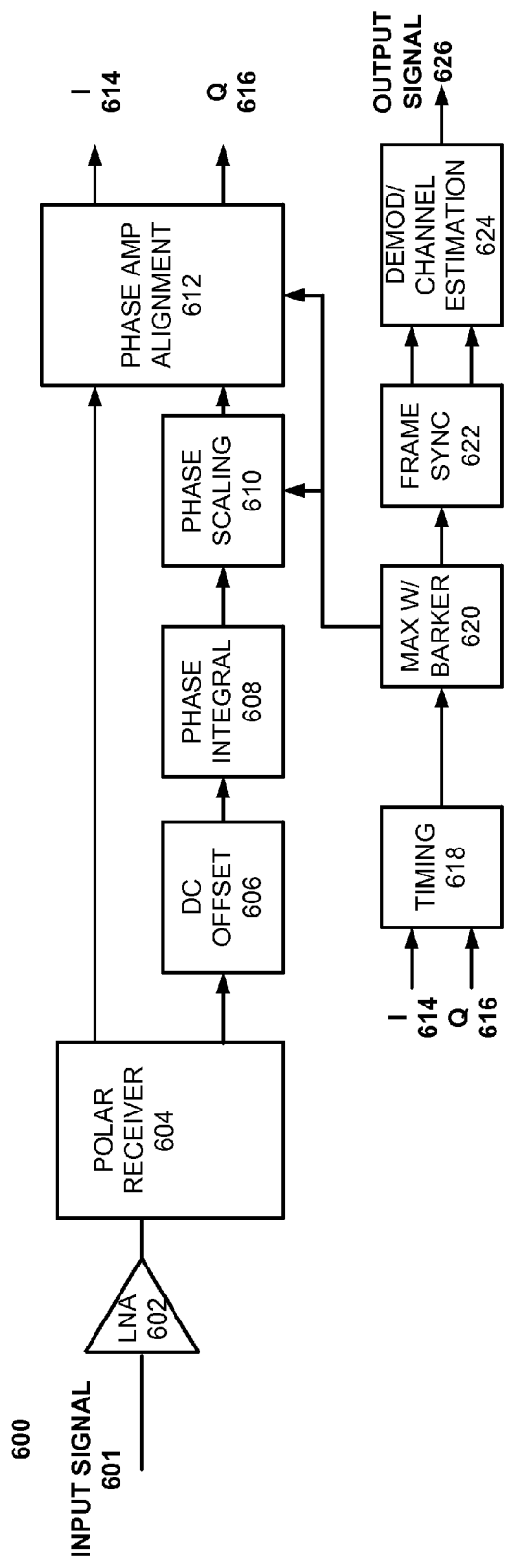
FIG. 6 is a block diagram of a portion of a polar demodulator circuit in accordance with some embodiments.

With reference to FIG. 6 is a block diagram of a portion of a polar demodulator circuit in accordance with some embodiments. In particular, FIG. 6 shows a block diagram of an example receiver 600. An input signal 601 is capture by the example receiver 600 and passed through a low noise amplifier (LNA) 602 and a polar receiver 604. One such suitable LNA is described in copending application Attorney Docket 71603.US.01 filed Mar. 15, 2013, entitled LNA With Linearized Gain Over Extended Dynamic Range. Such an LNA provides appropriate adjacent channel rejection as well as amplification, as described more fully in the referenced application.

The output signal of the polar receiver 604 is provided as an input signal to a DC offset circuit 606 and as an input signal to the phase and amplitude alignment circuit 612. Further, the output of the DC offset circuit 606 is provided to a phase integral circuit 608. In addition, the output signal of the phase integral circuit 608 is provided as an input signal to the phase scaling circuit 610. Moreover, the output signal of the phase scaling circuit 610 is provided to the phase and amplitude alignment circuit 612. The phase and amplitude alignment circuit 612 provides an in-phase (I) signal 614 and a quadrature (Q) signal 616.

The example receiver 600 further includes a timing circuit 618 that is provided the I and Q signals (614 and 616). The output signal of the timing circuit 618 is provided to the correlator circuit 620 that detects the maximum of the signal with respect to a Barker code correlation. Further, the output signal of the correlator circuit 620 is fed back to both the phase scaling circuit 610 and the phase and amplitude alignment circuit 612. The feedback may be used to adjust the scaling and/or the phase and amplitude alignment. In addition, the output signal of circuit 620 is provided to a frame synchronization circuit 622. Moreover, the output signals of the frame synchronization circuit 622 are provided to a demodulator/channel estimation circuit 624 to provide a receiver output signal 626.

Figure 7:
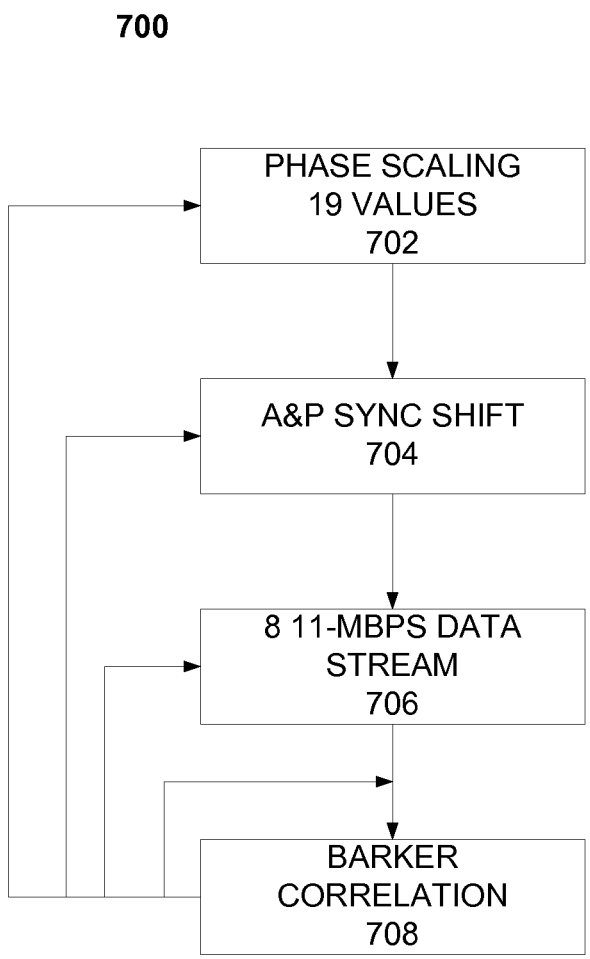
FIG. 7 is a flow chart of a method of calibrating a polar demodulator circuit in accordance with some embodiments.

FIG. 7 is a block diagram of an example method 700. The example method 700 includes phase scaling that may evaluate some number of discrete scaling values of the phase signal, as shown in block 702. In one embodiment 19 different values are used, but other numbers may be used. The scaling factors may be linearly spaced, or may have a nonlinear spacing. Because the phase information is presented as a signal amplitude such as a voltage signal, and yet must be converted to an I and Q channel, using for example a sine-cosine lookup table (LUT), the mapping between the voltage signal and the angular values must be established. In one embodiment, the phase variations may be analyzed for step transitions characteristic of most digital PSK signals, and then scaled appropriately by mapping the voltage transitions to those expected phase steps. In alternative embodiments, the scaling may be adjusted incrementally, using a binary tree search, or exhaustive search, and measuring the performance of the receiver accordingly. The iterative method may be evaluated based on the performance of the barker correlation circuit in embodiment where the received modulated signal includes barker coding (or other spreading codes that may provide a coding gain).

Because an incorrect scale (mapping of voltage to phase angle) may result in rotations of the desired signal points, a further embodiment may include a Barker correlation circuit configured with a plurality of correlators, each correlator testing for the presence of a sequentially rotated Barker sequence in the IQ signals.

The example method 700 further includes synchronizing (i.e., shifting in time) of the amplitude and phase (A&P) of the signal, as shown in block 704, to evaluate the performance of the receiver using different alignments of these signals. In one embodiment, various time offsets are set in an iterative or exhaustive fashion, and the performance of the Barker correlation circuit is used to evaluate a best-performing time offset. In a further embodiment, a correlation may be run against the phase signal to identify the presence of a predetermined phase characteristic of a synchronization sequence, and a second correlation may be performed on the envelope/amplitude signal, with the results being used to align the signals accordingly. In a further embodiment, a coarse alignment may be performed using separate amplitude and phase correlations followed by a finer alignment using an iterative procedure.

In one embodiment, the example method 700 includes eight 11-Mbps data streams, as shown in block 706, which may 8 samples per symbol (or chip) period. A separate Barker correlation may performed on each of the eight 11-Mbps data streams, as shown block 708. In some embodiments, the Barker correlation may be fed back to the phase scaling module, amplitude and phase synchronization module, and the eight 11-Mbps data streams.

Further details of the polar demodulator circuit and the calibration procedure are set forth in Attorney Docket 71602.US.01, filed Mar. 15, 2013, entitled POLAR RECEIVER SIGNAL PROCESSING APPARATUS AND METHODS.

Figure 8:
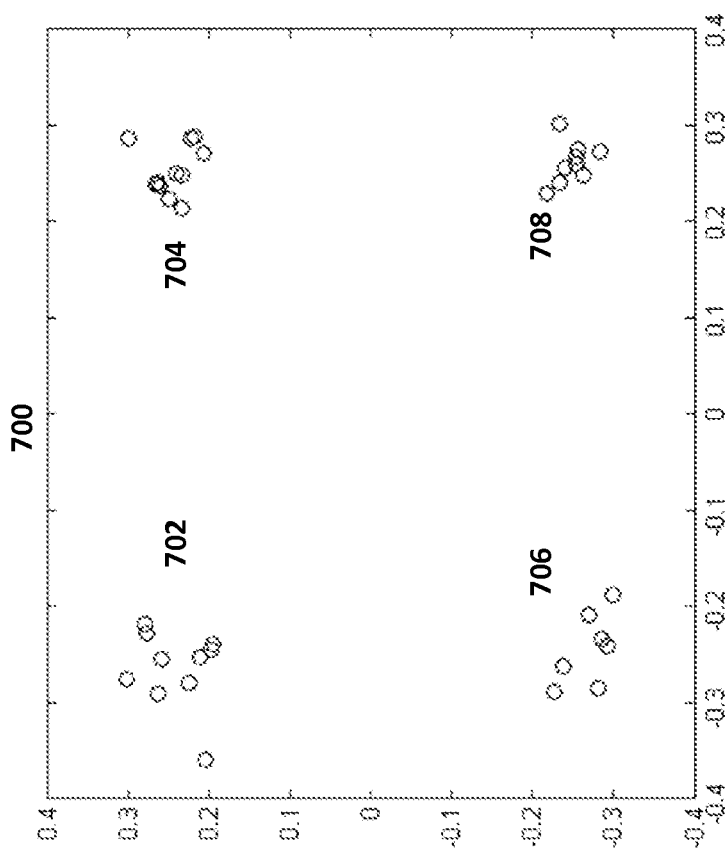
FIG. 8 is a signal plot of a QPSK signal output recovered using a polar demodulator circuit in accordance with some embodiments.

With reference to FIG. 8, a signal plot of a QPSK signal output recovered using a polar demodulator circuit as described herein is shown.

Figure 9:
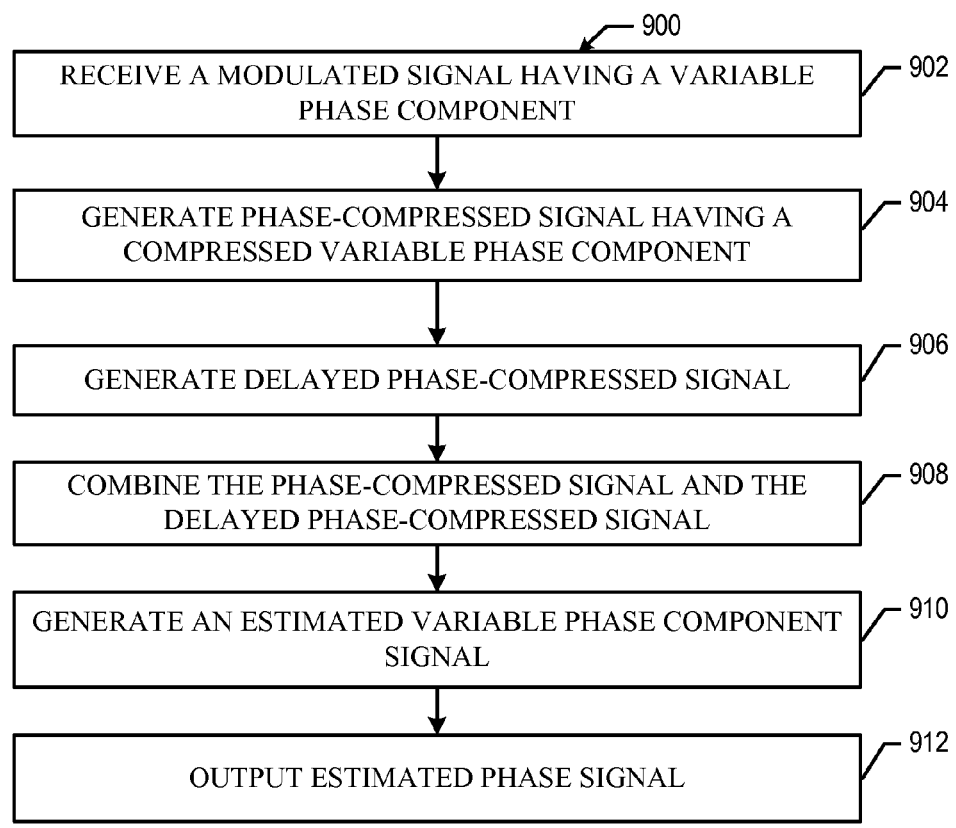
FIG. 9 is a flow chart depicting a method of signal demodulation in accordance with some embodiments.

Now, with reference to the flow chart of FIG. 9, an embodiment of a method 900 of signal demodulation will be described. In an embodiment, the method 900 may comprise receiving a modulated signal having a variable phase component 902. The variable phase component may include phase variations in a first phase range. The received modulated signals may have a first range of phase variations of $\pm\phi$ radians, and the second range of phase variations is $\pm\phi/2$ radians. In one embodiment $\phi=\pi$ radians.

The general phase range may be determined by the nature of the modulation of signal, or may generally be considered to be $\pm\pi$ radians. The received modulated signal may be a phase shift keying signal, a quadrature amplitude modulated signal, a single carrier or multicarrier signal such as an orthogonal frequency division multiplexed signal.

The method may also include generating a phase-compressed signal having a compressed variable phase component 904. The compressed variable phase component may be generated by processing the received modulated signal with a second harmonic injection locking oscillator. As described above, the compressed variable phase component includes phase variations in a compressed phase range being substantially one half the first phase range, and more generally confined to $\pm\pi/2$ radians.

At 906, a delayed phase-compressed signal may be generated having a delayed compressed variable phase component that is delayed relative to the compressed variable phase component. The amount of delay may be adjusted to obtain a desired signal mixing at the mixer output. At 908, the phase-compressed signal and the delayed phase-compressed signal are combined to obtain an estimated derivative of the variable phase component. At 910, an estimated variable phase component signal is generated. The estimated variable phase component may be generated by filtering the estimated derivative of the variable phase component with a low pass filter. The lowpass filtering may also be followed by an integrator. An integrator may also be implemented by a low pass filter. The estimated phase signal may be output, or otherwise provided to a polar demodulation circuit at 912.

In some embodiments, generating the phase-compressed signal may further comprise removing substantially all amplitude variations from the received modulated signal. In still further embodiments, the method may further comprise detecting a magnitude of the received modulated signal in the event the received modulated signal also has a variable magnitude component.

The method of some embodiments may further comprise adjusting parameters of the second harmonic ILO to change the free-running frequency of the second harmonic ILO. Furthermore, adjusting one or more parameters of the second harmonic ILO may include adjusting an injection coefficient, a quality factor, and/or a free running frequency of a tank circuit.

In another embodiment, an amount of delay associated with the delayed phase-compressed signal is adjusted, by for example, adjusting one or more parameters of the fundamental ILO including an injection coefficient, a quality factor, and a resonant frequency of a tank circuit.

In some embodiments, combining the phase-compressed signal and the delayed phase-compressed signal is performed using a signal mixer, such as a Gilbert Cell.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method comprising:
   receiving a modulated signal having a variable phase component wherein the variable phase component includes phase variations in a first phase range;
   generating a phase-compressed signal having a compressed variable phase component by processing the received modulated signal with a second-harmonic injection locking oscillator (ILO), wherein the compressed variable phase component includes phase variations in a compressed phase range being substantially one half the first phase range;
   generating a delayed phase-compressed signal having a delayed compressed variable phase component that is delayed relative to the compressed variable phase component;
   combining the phase-compressed signal and the delayed phase-compressed signal to obtain an estimated derivative of the variable phase component;
   generating an estimated variable phase component signal by filtering the estimated derivative of the variable phase component; and, providing the estimated phase signal to a polar demodulation circuit.

2. The method of claim 1 wherein the first range of phase variations is ±φ radians, and the second range of phase variations is ±φ/2 radians.

3. The method of claim 2 wherein φ=π radians.

4. The method of claim 1 wherein the received modulated signal is a phase shift keying signal.

5. The method of claim 1 wherein the received modulated signal is a quadrature amplitude modulated signal.

6. The method of claim 1 wherein the received modulated signal is a single carrier signal.

7. The method of claim 1 wherein the received modulated signal is an orthogonal frequency division multiplexed signal.

8. The method of claim 1 wherein generating the phase-compressed signal further comprises removing substantially all amplitude variations from the received modulated signal.

9. The method of claim 1 wherein the received modulated signal also has a variable magnitude component, further comprising detecting the magnitude of the received modulated signal.

10. The method of claim 1 further comprising adjusting parameters of the second-harmonic ILO to change free-running frequency of the second harmonic ILO.

11. The method of claim 1 further comprising adjusting one or more parameters of the second-harmonic ILO wherein the one or more parameters include a parameter selected from the group consisting of an injection coefficient, a quality factor, and a resonance frequency of the ILO.

12. The method of claim 1 wherein an amount of delay associated with the delayed phase-compressed signal is adjusted.

13. The method of claim 1 wherein the delayed phase-compressed signal is generated at output of a fundamental ILO injected with the phase-compressed signal.

14. The method of claim 13 further comprising adjusting one or more parameters of the fundamental ILO wherein the one or more parameters include a parameter selected from the group consisting of an injection coefficient, a quality factor, and a resonance frequency of the ILO.

15. The method of claim 14 wherein adjusting one or more parameters is performed to adjust an amount of delay associated with the delayed phase-compressed signal.

16. The method of claim 1 wherein combining the phase-compressed signal and the delayed phase-compressed signal is performed using a signal mixer.

17. The method of claim 1 wherein filtering the estimated derivative of the associated variable phase component includes lowpass filtering the estimated derivative.

18. The method of claim 1 further comprising using the polar demodulation circuit to recover data based on the estimated phase signal.

19. An apparatus comprising:
a second-harmonic injection locking oscillator (ILO) configured to generate a phase compressed signal having a compressed variable phase component relative to a variable phase component of an ILO input signal;
a fundamental ILO connected to the second-harmonic ILO configured to generate a delayed phase-compressed signal;
a mixer configured to combine the phase-compressed signal and the delayed phase-compressed signal, and to output a signal containing an estimated derivative of the variable phase component; and,
a filter configured to generate an estimated variable phase component signal from the estimated derivative of the variable phase component.

20. The apparatus of claim 19 further comprising a control circuit configured to (i) adjust one or more parameters of the second harmonic ILO to change the free-running frequency of the second harmonic ILO to be near a carrier frequency of a desired channel and to (ii) adjust one or more parameters of the fundamental ILO to change the free-running frequency of the fundamental ILO to be near one-half the carrier frequency of the desired channel.

21. An apparatus comprising:
a second-harmonic injection locking oscillator (ILO) having an input node and compressed signal output node, configured to receive a modulated signal having a variable phase component with phase variations in a first phase range, and to generate, at the compressed output, a phase-compressed signal having a compressed variable phase component in a compressed phase range being substantially one half the first phase range;
a fundamental ILO having an input node connected to the compressed output node, and a delayed-output node, the fundamental ILO configured to generate, at the delayed output node, a phase-compressed signal having a delayed compressed variable phase component that is delayed relative to the compressed variable phase component;
a mixer having a first input node connected to the compressed output node and a second input node connected to the delayed-output node, configured to combine the phase-compressed signal and the delayed phase-compressed signal, and to output, at a mixer output node, a signal containing an estimated derivative of the variable phase component;
a filter configured to generate an estimated variable phase component signal from the estimated derivative of the variable phase component.

22. The apparatus of claim 21 further comprising a polar demodulation circuit configured to recover data information from the estimated variable phase component signal.

23. The apparatus of claim 21 wherein the first range of phase variations is ±φ radians, and the second range of phase variations is ±φ/2 radians.

24. The apparatus of claim 21 wherein the received modulated signal is one of either a phase shift keying signal, a quadrature amplitude modulated signal, a single carrier signal, or an orthogonal frequency division multiplexed signal.

25. The apparatus of claim 21 wherein the second-harmonic ILO is configured to generate a phase-compressed signal having substantially reduced amplitude variations relative to the received modulated signal.

26. The apparatus of claim 21 further comprising an amplitude detector configured to receive the received modulated signal and to output a magnitude signal representative of the magnitude of the received modulated signal.

27. The apparatus of claim 21 further comprising a control circuit configured to adjust parameters of the second-harmonic ILO to change free-running frequency of the second harmonic ILO.

28. The apparatus of claim 21 further comprising a control circuit configured to adjust one or more parameters of the second-harmonic ILO wherein the one or more parameters include a parameter selected from the group consisting of an injection coefficient, a quality factor, and a capacitance of a tank circuit.

29. The apparatus of claim 21 further comprising a control circuit configured to adjust one or more parameters of the fundamental ILO to adjust an amount of delay associated with the delayed phase-compressed signal.

30. The apparatus of claim 29 wherein the one or more parameters include a parameter selected from the group consisting of an injection coefficient, a quality factor, and a capacitance of a tank circuit.

* * * * *